US005616863A

United States Patent [19]

Koen

[11] Patent Number: 5,616,863
[45] Date of Patent: *Apr. 1, 1997

[54] SIDE SURFACE MOUNTED ACCELEROMETER ASSEMBLY

[75] Inventor: Edward F. Koen, Danville, Calif.

[73] Assignee: IC Sensors, Inc., Milpitas, Calif.

[*] Notice: The term of this patent shall not extend beyond the expiration date of Pat. No. 5,503,016.

[21] Appl. No.: 569,402

[22] Filed: Dec. 6, 1995

Related U.S. Application Data

[63] Continuation of Ser. No. 189,948, Feb. 1, 1994, Pat. No. 5,503,016.

[51] Int. Cl.$^6$ ........................................ G01P 1/02
[52] U.S. Cl. ............................... 73/493; 73/431
[58] Field of Search .............................. 73/493, 431, 777, 73/756, 866.5, 204.22, 856; 174/260

[56] References Cited

U.S. PATENT DOCUMENTS

| | | | |
|---|---|---|---|
| 4,700,973 | 10/1987 | Gademann | 73/493 |
| 5,012,316 | 4/1991 | Silvermint | 357/26 |
| 5,043,791 | 8/1991 | Stokes et al. | 357/74 |
| 5,044,201 | 9/1991 | Farace et al. | 73/503 |
| 5,060,504 | 10/1991 | White et al. | 73/1 D |
| 5,109,341 | 4/1992 | Blackburn et al. | 364/424.05 |
| 5,163,325 | 11/1992 | White et al. | 73/517 R |
| 5,221,400 | 6/1993 | Staller et al. | 156/292 |
| 5,233,871 | 8/1993 | Schwarz et al. | 73/493 |
| 5,233,873 | 8/1993 | Mozgowiec | 73/493 |
| 5,233,874 | 8/1993 | Putty et al. | 73/517 AV |
| 5,241,861 | 9/1993 | Hulsing, II | 73/505 |
| 5,249,465 | 10/1993 | Bennett et al. | 73/510 |
| 5,261,694 | 11/1993 | White et al. | 280/735 |
| 5,269,187 | 12/1993 | Hanson | 73/495 |
| 5,394,326 | 2/1995 | Liu | 364/424.05 |
| 5,503,016 | 4/1996 | Koen | 73/493 |

FOREIGN PATENT DOCUMENTS

| | | |
|---|---|---|
| 557917A1 | 9/1993 | European Pat. Off. . |
| 2720484 | 11/1977 | Germany . |
| 60-12570 | 1/1985 | Japan . |
| 63-90774 | 4/1988 | Japan . |
| WO91/11722 | 8/1991 | WIPO . |

OTHER PUBLICATIONS

NEC Sales Brochure, "NEC's Automotive Electronic Control Modules", date unknown, 1 pg.

Frank Goodenough, "Airbags Boom When IC Acceleromter Sees 50g", Electronic Design, Aug. 8, 1991, 8 pgs.

Primary Examiner—Christine K. Oda
Attorney, Agent, or Firm—Skjerven, Morrill, MacPherson, Franklin & Friel; Norman R. Klivans

[57] ABSTRACT

Micro-machined accelerometer chips have a sensitive axis perpendicular to the principle surface of the device. In an application where the desired sensing direction is in the plane of a supporting printed circuit board, the accelerometer cannot be mounted directly on the printed circuit board and instead is mounted on a wall perpendicular to the printed circuit board. This requirement to wall-mount the sensor is eliminated by using an accelerometer chip packaged with a signal conditioning circuit in a multi layer ceramic chip carrier. Electrical connections are contained within the layers of the ceramic and terminate at a side surface of the chip carrier. Thus the accelerometer chip sits perpendicular to the printed circuit board and the ceramic chip carrier is attached directly thereto.

28 Claims, 4 Drawing Sheets

SIDE SURFACE MOUNTED ACCELEROMETER ASSEMBLY

CROSS REFERENCE TO RELATED APPLICATION

This Application is a continuation of U.S. patent application Ser. No. 08/189,948, filed Feb. 1, 1994, now U.S. Pat. No. 5,503,016.

BACKGROUND OF THE INVENTION

1. Field of the Invention

This disclosure relates to sensing variations in velocity such as in a motor vehicle, and more particularly to a method and structure for mounting an accelerometer on a support.

2. Description of the Prior Art

Micro-machined chip accelerometers are well known in the art. Examples are disclosed in U.S. Pat. No. 5,060,504 issued Oct. 29, 1991 to White, et al., U.S. Pat. No. 5,221,400 issued Jun. 22, 1993 to Staller, and U.S. Pat. No. 5,233,874 issued Aug. 10, 1993 to Putty et al. As is well known, an accelerometer is a device which measures acceleration, or more accurately measures force exerted by a body as a result of a change in the velocity of the body. A moving body possesses an inertia which tends to resist the change in velocity. It is this resistance to any change in velocity that is the source of the force exerted by the moving body. This force is directly proportional to the acceleration component in the direction of movement when the moving body is accelerated.

In a typical micro-machined accelerometer formed of silicon (a "chip"), a central, typically spherical or rectangular shaped mass is suspended by one or more micro-bridges. The bridges are attached to a supporting substrate which circumscribes the mass, with a gap provided therebetween. The mass is supported within and has free movement relative to the supporting substrate. The individual micro-bridges within e.g. each pair of micro-bridges are positioned at opposing edges of the mass such that the pair's longitudinal axis constitutes a common axis across the surface of the mass.

The movement of the mass is measured, for instance, by measuring a corresponding change in the output of a Wheatstone bridge incorporating beam piezo-resistors formed in the micro-bridges.

Typically such micro-machined silicon chip accelerometers require external circuitry to process the signal output by the accelerometer, for instance for triggering an automobile air bag deployment system. Such accelerometers hence are commonly used in automobiles and other vehicles.

Accelerometers are constrained in that typically a micro-machined accelerometer as described above has a single axis sensitive to acceleration. That is, it can only measure acceleration along a line perpendicular to a plane defined by the principal surface of the chip. The principal surface of the chip is in the plane of the chips, from which side during fabrication various fabrication steps (masking, etching, etc.) are performed. For an automobile airbag system the direction of acceleration which must be sensed in the event of a collision is typically along a line lying in a horizontal plane (parallel to the ground).

A typical prior art structure for mounting such a micro-machined accelerometer chip is shown in a front view in FIG. 1a. Here a conventional metal "can" chip package 12 defines a central recess 10 in which are conventionally mounted the actual accelerometer chip 14 and the associated electronic circuitry, here present in ASIC circuit 16. ASIC means Applications Specific Integrated Circuit which is typically used, but other types of integrated circuit will also perform this function. It is to be understood that in some such accelerometers, this circuitry is integrated on the accelerometer chip itself.

The accelerometer chip 14 is electrically connected to the ASIC chip 16 by conductors 18 carrying electrical signals between the two chips 14, 16. The metal can 12 is sealed by a lid (not shown), while the accelerometer chip 14 and ASIC chip 16 are held on a ceramic substrate 20 fixed inside can 12. Also provided are screws 24a, 24b (and corresponding holes not shown) for securing can 12 to a mounting bracket (described below).

The electrical conductive leads which connect chips 14 and 16 to the remainder of the system (the actual connection is not shown for simplicity here) terminate in this case at conventional edge clip terminations (pins) 28a, 28b, etc. These electrically connect to printed circuit board (PCB) 36 held by standoffs 38a, 38b on the floor of metal housing 40.

To better illustrate the structure of FIG. 1A, a side view along line A—A of FIG. 1a is shown in FIG. 1b. The lid which seals (by a weld) can 12 (omitted from FIG. 1a) is designated by reference number 26. FIG. 1b also illustrates the support structure for the can 12, which is mounted on a metal base plate 28 with glass to metal seals. Base plate 28 in turn is attached by screws 24a, 24b to a mounting bracket 34. Mounting bracket 34 is a robust structure formed for instance of metal, plastic or ceramic. The purpose of mounting bracket 34 is to properly mount can 12 in a vertical orientation on the sidewall of housing 40. Bracket 34 is held onto the sidewall by screws, rivets, or other means (not shown). The direction of acceleration is as shown by the arrow labelled "AXIS of ACCEL". Thus the sole purpose of base plate 28 and mounting bracket 34 is to vertically mount can 12 so that it is perpendicular to PCB 36. Typically in a vehicle, PCB 36 is thereby installed in a plane parallel to that of the surface of the earth.

As shown, lead 28a (and the other leads 28b, . . . , 28g) extend from behind metal can 12 (detail not shown for simplicity) to connect to electrical connectors on PCB 36. PCB 36 provides the connections to the actual air bag firing device, typically housed in the steering wheel, whereas the housing 40 is typically mounted under the dash board or on the floor board of the vehicle. The structure of FIGS. 1a and 1b functions satisfactorily. However it has the major disadvantages of being relatively bulky and expensive due to the rather elaborate mounting structure required to rigidly mount the accelerometer chip in the desired orientation relative to 1) its axis of sensitivity; and 2) the horizontally mounted PCB 36. Also, the relative complexity of the mechanical structure and leads 28 cause reliability problems.

Analog Devices has disclosed (*Electronic Design*, Aug. 8, 1991, "Airbags Boom When IC Accelerometer Sees 50 G" see FIG. 5) a micro-machined accelerometer chip whose mass moves in the plane of the chip. This chip allows the axis of sensitivity to be parallel to the expected acceleration phenomenon. However, this is a special accelerometer chip apparently available only from this single supplier.

Thus it would be highly desirable to reduce the cost and increase reliability of mounting accelerometer chips in an automobile, other vehicle, or other application without the need for an expensive and bulky mounting structure, and using a standard accelerometer chip.

SUMMARY OF THE INVENTION

In accordance with the invention, an accelerometer chip whose sensing direction is conventionally perpendicular to the plane (principal surface) of the chip is housed in a chip carrier and mounted directly on the printed circuit board, edge-wise. That is, a side surface of the chip carrier (package) is mounted directly on the surface of the PCB.

The conventional micro-machined silicon accelerometer chip, packaged with signal conditioning circuitry (e.g., an ASIC) in e.g. a multi-layer ceramic chip carrier, may be hermetically sealed with an e.g. Kovar lid. Electrical connections are contained within the layers of the ceramic chip carrier and terminated at the bottom (actually the side surface) of the chip carrier.

The flexibility of types of terminations from the ceramic chip package offer a variety of mounting schemes to the supporting PCB, such as leadless surface mount, or formed metal leads such as J-formed leads, S-formed leads, gull wings, side brazed with standoff leads, and others.

Alternatively, the accelerometer chip is packaged in a plastic SIP (single in-line package) chip package mounted on a lead frame, with the side of the package being mounted to the PCB and the leads connecting to the PCB.

Thus in accordance with the invention a low cost, compact, and highly reliable mounting is provided for an accelerometer chip.

DETAILED DESCRIPTION OF THE INVENTION

Figure 1A:
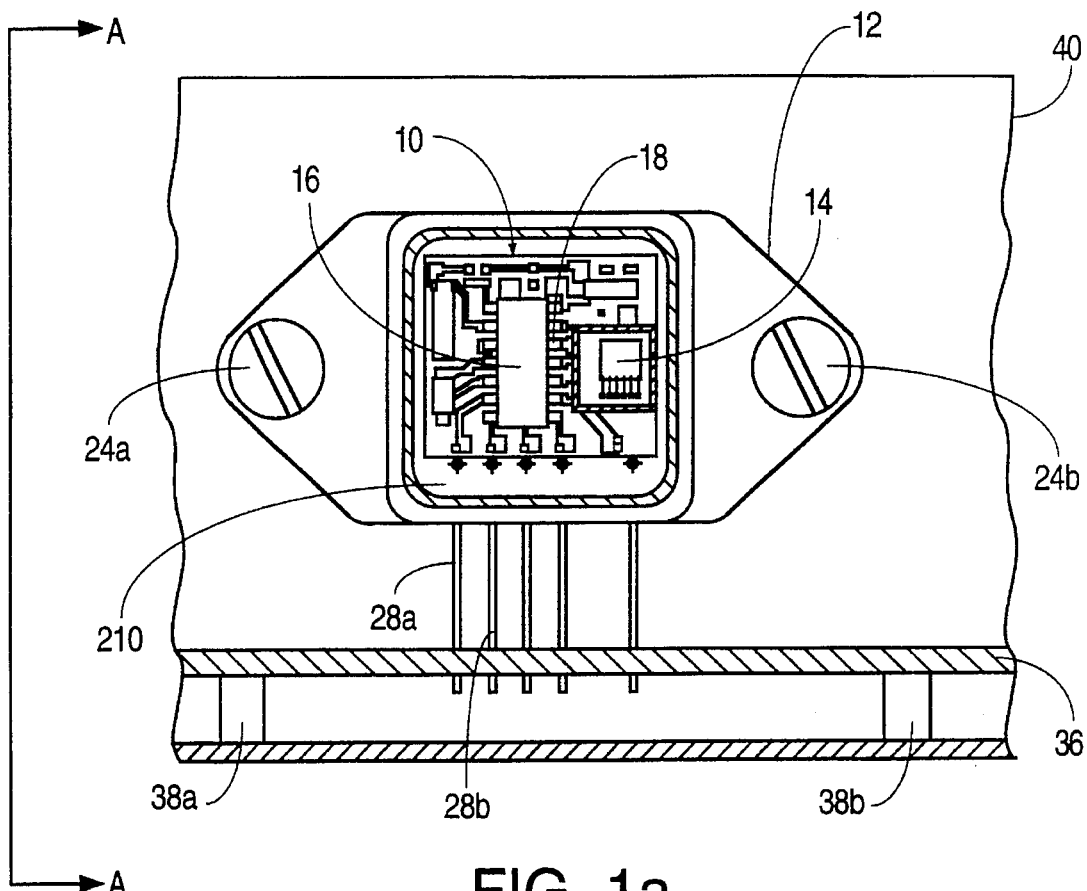
FIG. 1a and FIG. 1b show respectively front and side views of a prior art accelerometer mounting structure.
Figure 1B:
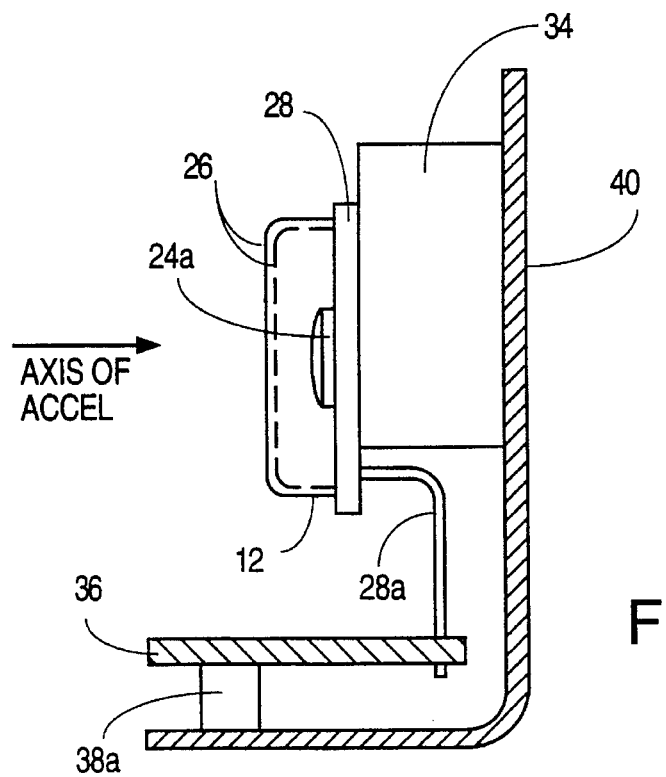
Figure 2A:
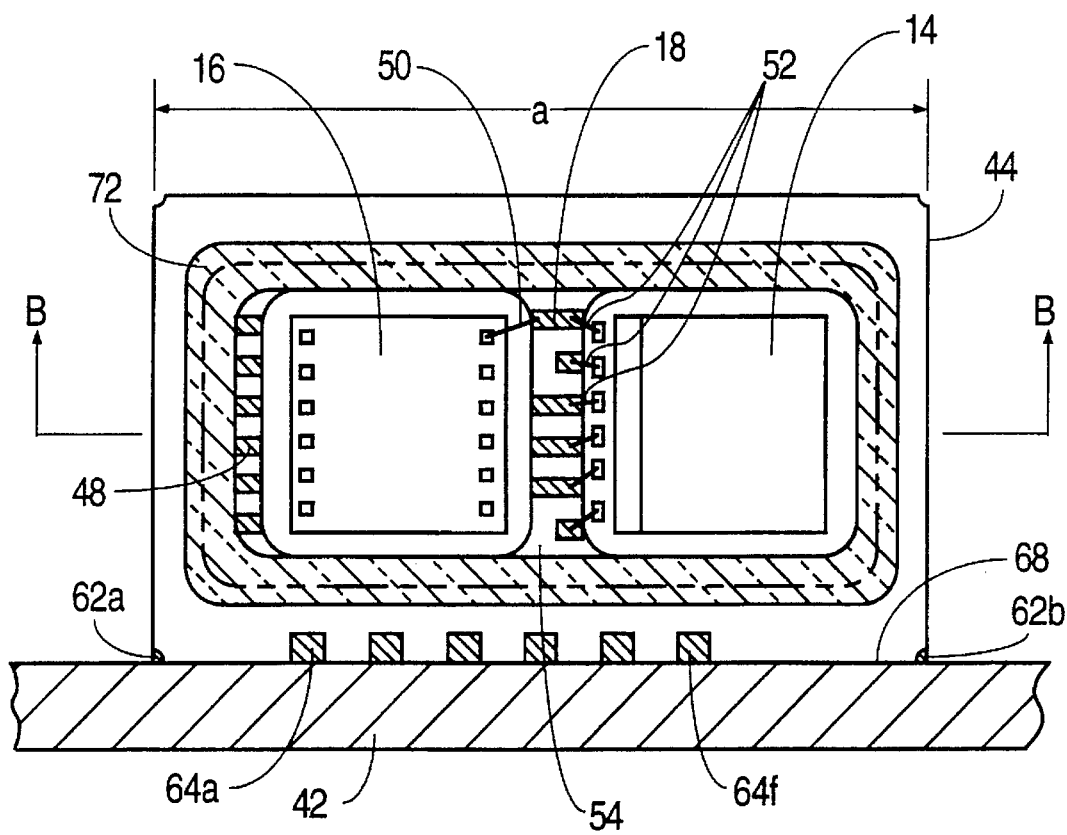
FIGS. 2a, 2b, 2c and 2d show respectively a front view, a cross sectional view, a side surface view (when mounted), and a second side view of a mounting structure for an accelerometer chip in accordance with the invention.

FIG. 2a shows a front view of a accelerometer chip 14 and a signal conditioning (e.g. an ASIC) chip 16 housed in a multi-layer ceramic chip carrier 44 of the type well known in the art. Conventional accelerometer chip 14 and ASIC chip 16 are housed in a recess 54 which is stepped to accommodate the different thicknesses of these two devices. In FIG. 2a, the lid which would normally seal the chip carrier 44 is shown removed. Chip carrier 44 is mounted on a conventional PCB 42 by solder pads 64a, . . . , 64f (only a portion of which is shown in FIG. 2a) each of which is formed on the underside of chip carrier 44 and thus provide a mechanical and electrical attachment to corresponding metallized areas on the printed circuit board 42. The actual fillets of the two resulting solder bonds are designated by reference number 62a, 62b. PCB 42 is the PCB conventionally present in vehicles, as described above, for mechanically supporting and electrically connecting to an accelerometer chip.

PCB 42 is conventionally G10/FR-4 material, but may be other materials as are well known in the art. In this view of FIG. 2a, the axis of acceleration is into or out of the page, and hence is not illustrated. The principal surface of chip 14 is illustrated with the conventional protective cap installed. Accelerometer chip 14 is connected by wire bonds 52 to conductive traces 18 formed on the exposed surface of the ceramic chip carrier 44 and hence connects via wire bond 50 (and others, not shown) to the ASIC chip 16. (Accelerometer chip 14 also may have one or more electrical connections direct to the outside of chip package 44 via traces 18). Typically additional sets of such traces and wire bonds are present, but these are not shown here for simplicity. Alternative bonding methods include TAB, flip chip, and others known in the art. Also shown are conductive traces 48 to the left of ASIC 16, which penetrate through the multi-layers of chip carrier 44, and emerge at the side surface (here shown as a lower portion) of chip carrier 44 at solder pads 64a, . . . , 64f.

Both ASIC 16 and accelerometer chip 14 are housed in stepped recess 54 in chip carrier 44.

Figure 2B:
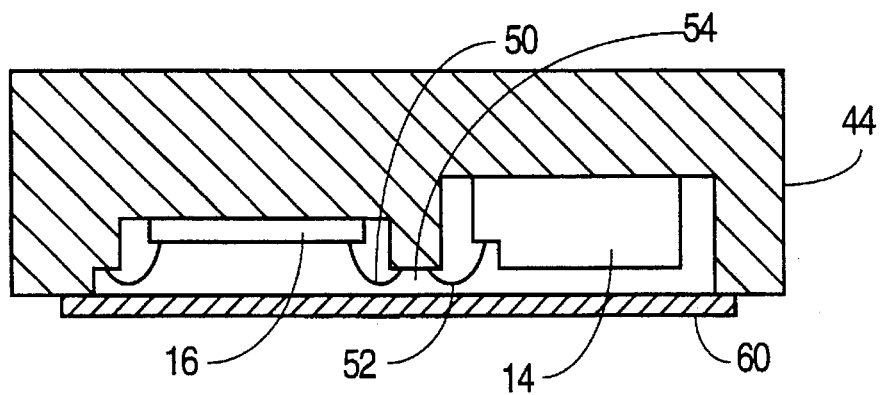

A cross section through line B—B of FIG. 2a is shown in FIG. 2b, showing the chip carrier 44, recess 54, chips 14 and 16 and the Kovar cap 60 which seals the chip carrier package 44. Kovar cap 60 has formed on its inner surface a conventional solder sealing ring of tin and gold which mates to corresponding ring 72 of layered, tungsten, nickel, and gold on chip package 44. Also shown are wire bonds 50, 52. The ASIC 16 is considerably thinner than the accelerometer chip 14 and hence is housed in a shallower portion of stepped recess 54, so as to achieve coplanarity for easier wire bonding. (This detail is not critical.)

Figure 2C:
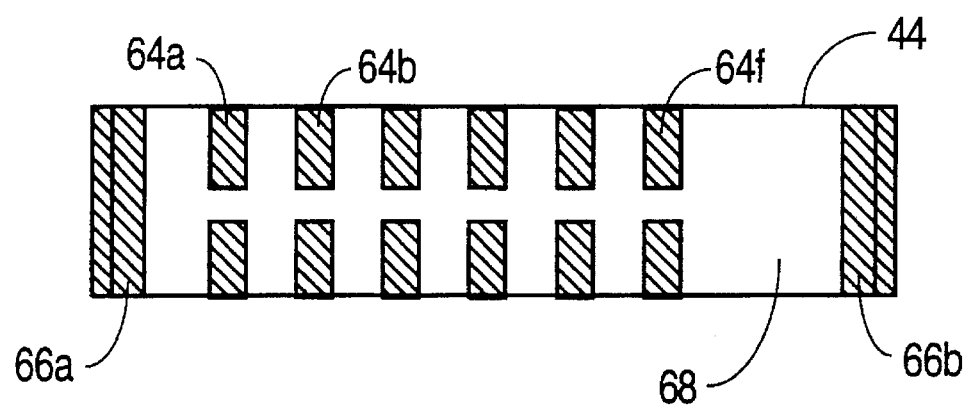

FIG. 2c shows a "bottom" view of a chip carrier 44 i.e. shows the side surface 68 of chip carrier 44 in FIG. 2a which is in intimate contact with PCB 42 as shown in FIG. 2a. Here the PCB 42 is not shown for illustrative purposes. Mechanical mounting solder pads 66a, 66b on the side surface 68 of chip carrier 44 extend the length of each end of the side surface 68 to achieve firm mechanical mounting to the underlying PCB 42. Pads 66a, 66b are optional. The electrical and mechanical contact solder pads 64a, 64f (and others not marked by reference numbers) are, as described above, in electrical contact with the accelerometer chip 14 and the circuitry of ASIC 16.

Figure 2D:
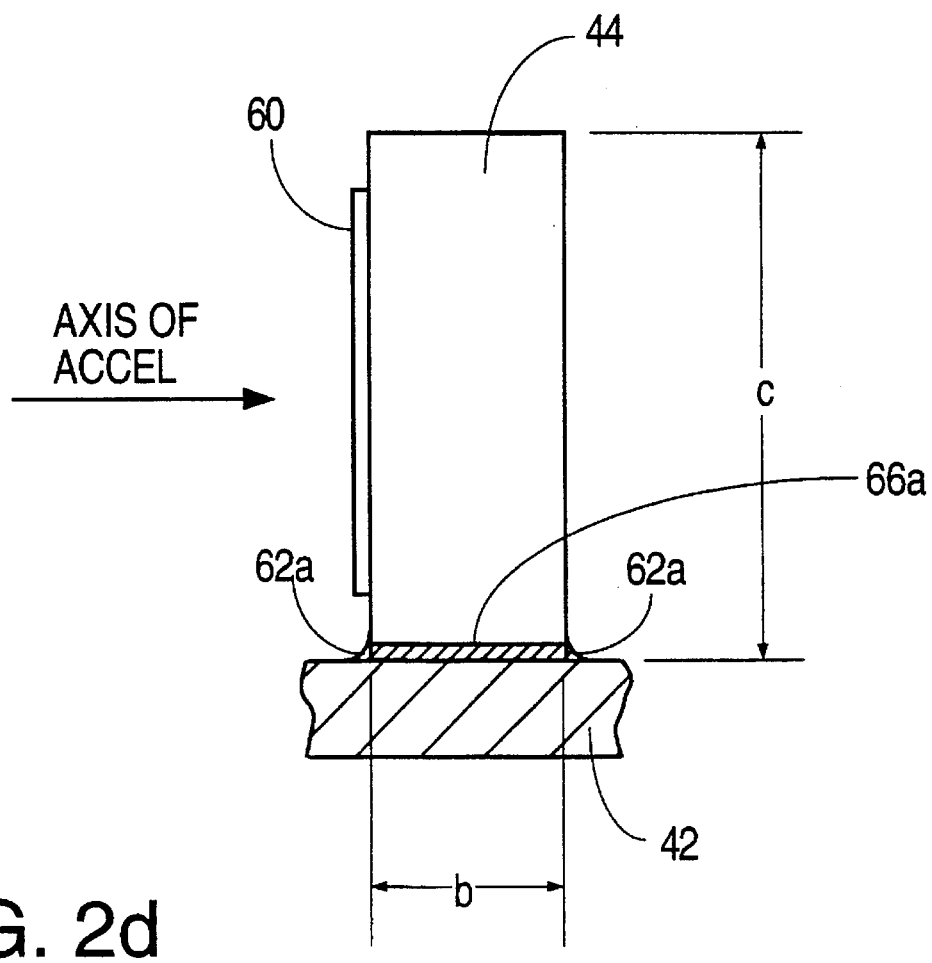

FIG. 2d shows a side view of chip carrier 44 with the cap 60 in place and again showing the actual solder fillet 62a to solder pad 66a as in FIG. 2a. Dimensions a, b and c in FIGS. 2a, 2d are in one embodiment respectively 0.5 inch, 0.125 inch, and 0.29 inch. These dimensions are illustrative only, as are the materials described herein, and are not intended to be limiting.

The accelerometer chip 14 used in accordance with the invention may be conventional (piezo-electric, piezo-resistive, capacitive) or of other types. The ASIC chip 16 of course is dispensed with if its functions are integrated on accelerometer chip 14. Advantageously the structure in accordance with the invention having its axis of sensitivity being parallel to the plane of the PCB reduces the overall size of the package, reduces the number of components, makes fabrication easier, and eliminates interconnections (electrical and mechanical) which are typically a source of failures. Thus reliability is increased while cost of materials and assembly is decreased over the prior art. As described above, the actual connections to the printed circuit board may be of various types in addition to the leadless surface mount type shown in FIGS. 2a and 2d. For instance, formed metal leads of various types could be attached to pads 64a, . . . , 64f for contact to PCB 42.

In an alternate embodiment, accelerometer chip and signal conditioning chip 16 are stacked up and connected in a flip-chip configuration, then held in chip carrier 44.

Figure 3:
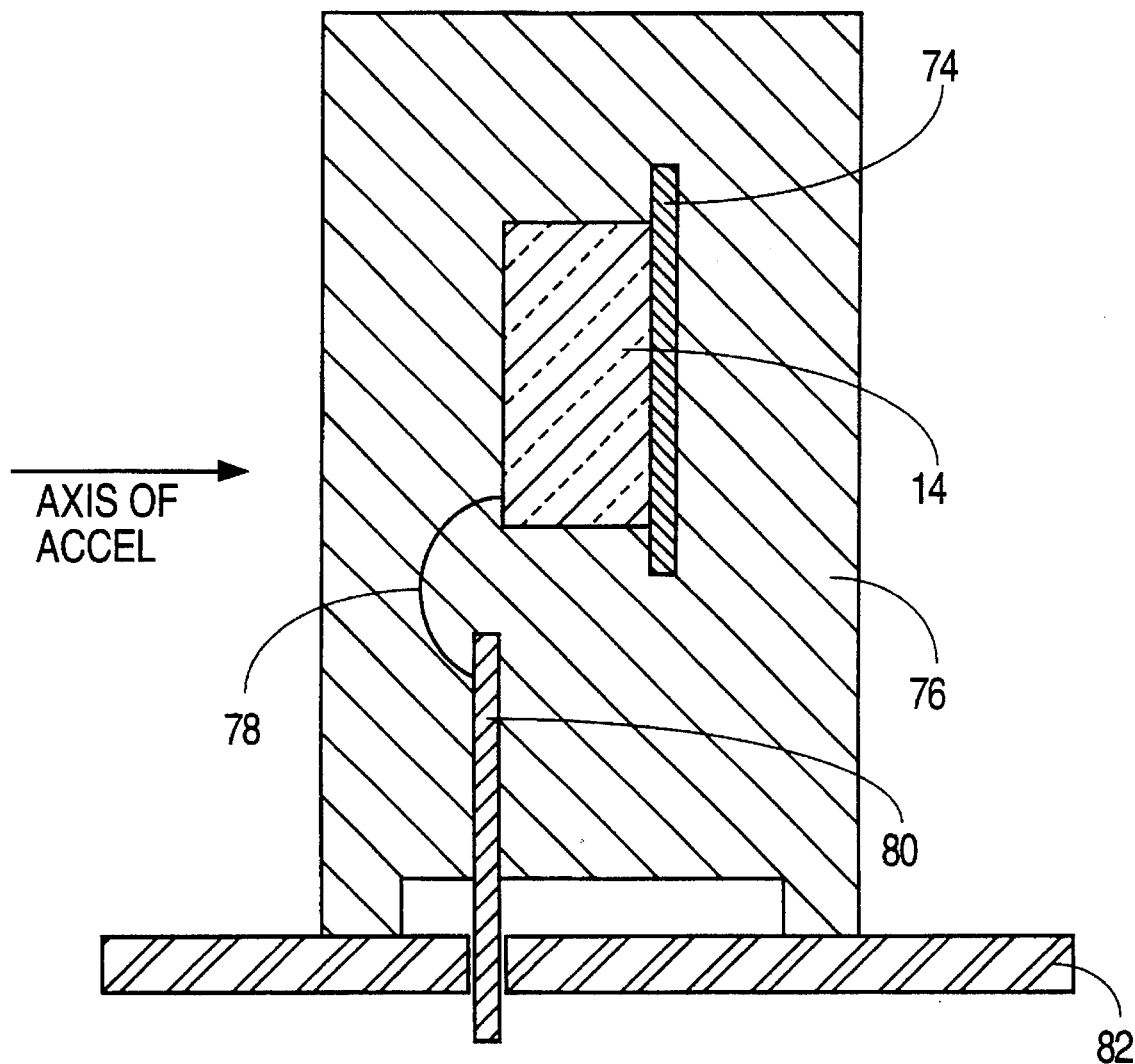
FIG. 3 shows a cross sectional view of a plastic chip carrier for an accelerometer chip in accordance with the invention.

Another embodiment shown in FIG. 3 in cross section in a side view has accelerometer chip 14 on support (die attach lead frame portion) 74 mounted in an SIP plastic chip carrier 76. The side surface of chip carrier 76 is then mounted to PCB 82. Conductor 78 from chip 14 contacts lead 80 other leads and conductors (not shown) which connects to PCB 82. Here lead 80 is part of the lead frame on which chip 14 (and a signal conditioning chip, not shown, if needed) is mounted. Alternatively, the lead frame terminations (leads) are staggered for additional support (not shown).

In accordance with the invention not only an accelerometer may be so mounted, but so may other force or other sensors (transducers) which have a single axis of sensitivity.

This disclosure is illustrative and not limiting; further modifications will be apparent to one of ordinary skill in the art in light of this disclosure and are intended to fall within the scope of the appended claims.

I claim:

1. A transducer assembly comprising:
   a transducer chip having an axis of sensitivity, the axis of sensitivity being at an angle to a plane defined by a principal surface of the transducer chip;
   a chip package which houses the transducer chip; and
   a circuit board, wherein a side surface of the chip package faces a surface of the circuit board and the chip package is directly supported by the circuit board.

2. The transducer assembly of claim 1, wherein at least a portion of the side surface of the chip package is in direct contact with the circuit board.

3. The transducer assembly of claim 2, wherein the portion of the side surface which is in direct contact with the circuit board defines at least one leg of the chip package.

4. The transducer assembly of claim 1, wherein the chip package is directly supported on the circuit board without any mounting bracket.

5. The transducer assembly of claim 1, wherein the side surface of the chip package is perpendicular to the principal surface of the transducer chip, so that the axis of sensitivity lies parallel to a plane defined by the surface of the circuit board.

6. The transducer assembly of claim 1, wherein the transducer chip is a micro-machined accelerometer.

7. The transducer assembly of claim 1, wherein the chip package is a multi-layer ceramic chip carrier defining an interior recess in which the transducer chip is fixed.

8. The transducer assembly of claim 1, further comprising a plurality of conductive elements connected to the transducer chip and extending through the chip package to the side surface thereof, the conductive elements connecting to contacts on the circuit board.

9. The transducer assembly of claim 8, wherein the conductive elements each include a conductive pad formed on the side surface of the chip package.

10. The transducer assembly of claim 1, further comprising a plurality of attachment pads formed on the side surface of the chip package, the attachment pads being bonded to the surface of the circuit board.

11. The transducer assembly of claim 7, further comprising a lid located over the interior recess and attached to the chip package.

12. The transducer assembly of claim 7, further comprising an integrated circuit mounted in the recess in the chip package, the integrated circuit being electrically connected to the transducer chip.

13. The transducer assembly of claim 1, wherein the chip package is a plastic lead frame package in which the transducer chip is fixed.

14. A method of mounting a transducer on a circuit board, the transducer having an axis of sensitivity lying at an angle to a plane defined by principal surface of the transducer, the method comprising the steps of:

fixing the transducer in a chip package, the chip package having conductive elements extending from a side surface of the chip package, so that the axis of sensitivity of the transducer lies parallel to a plane defined by the side surface of the chip package, and
   mounting the chip package on a surface of the circuit board, the side surface of the chip package facing the surface of the circuit board, and the conductive elements being in electrical contact with associated contacts on the circuit board.

15. The method of claim 14, wherein the principal surface of the transducer in the chip package is perpendicular to the side surface of the chip package.

16. A transducer device for mounting on a circuit board, the device comprising:
   a transducer chip having an axis of sensitivity lying at an angle to a plane defined by principal surface of the transducer chip;
   a chip package in which the transducer chip is affixed, the chip package having a side surface lying in a plane parallel to the axis of sensitivity; and
   a plurality of attachment points on the side surface of the chip package adapted to mounting the side surface facing a surface of the circuit board.

17. The transducer device of claim 16, wherein the side surface of the chip package is perpendicular to the principal surface of the transducer chip.

18. The transducer device of claim 16, wherein the transducer chip is a micro-machined accelerometer.

19. The transducer device of claim 16, wherein the chip package is a multi-layer ceramic chip carrier defining an interior recess in which the transducer chip is fixed.

20. The transducer device of claim 16, further comprising a plurality of conductive elements contacting the transducer chip and extending through the chip package to the side surface thereof, the conductive elements adapted to contacting electrical contacts on the circuit board.

21. The transducer device of claim 20, wherein the conductive elements each include a conductive pad formed on the side surface of the chip package.

22. The transducer device of claim 19, further comprising a lid located over the interior recess and attached to the chip package.

23. The transducer device of claim 19, further comprising an integrated circuit mounted in the interior recess in the chip package, the integrated circuit being electrically connected to the transducer chip.

24. The transducer device of claim 16, wherein the chip package is a plastic lead frame package.

25. The transducer device of claim 16 wherein the conductive elements are each an electrical lead extending from the side surface of the chip package.

26. The transducer device of claim 16, wherein the attachment points are each a leg of the chip package extending outward from the side surface of the chip package.

27. A transducer assembly comprising:
   a transducer chip having a principal surface;
   a chip package in which the transducer chip is housed, the chip package having a principal surface lying in a plane parallel to that of the principal surface of the chip and having a side surface perpendicular to the principal surface of the package; and
   a circuit board, wherein the side surface of the chip package faces a surface of the circuit board and the chip package is directly supported by the circuit board.

28. The transducer assembly of claim 27, wherein at least a portion of the side surface of the chip package is mounted directly to the surface of the circuit board.

* * * * *